United States Patent
Zhou et al.

(10) Patent No.: US 9,839,118 B2
(45) Date of Patent: Dec. 5, 2017

(54) METHOD AND ARRANGEMENT FOR BOARD-TO-BOARD INTERCONNECTION

(71) Applicant: TELEFONAKTIEBOLAGET L M ERICSSON (PUBL), Stockholm (SE)

(72) Inventors: Bo Zhou, Nanjing (CN); Junyou Chen, Nanjing (CN); Kun Liu, Nanjing (CN)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 41 days.

(21) Appl. No.: 15/031,369

(22) PCT Filed: Nov. 1, 2013

(86) PCT No.: PCT/CN2013/086407
§ 371 (c)(1),
(2) Date: Apr. 22, 2016

(87) PCT Pub. No.: WO2015/062067
PCT Pub. Date: May 7, 2015

(65) Prior Publication Data
US 2016/0249447 A1    Aug. 25, 2016

(51) Int. Cl.
*H01P 3/08* (2006.01)
*H01P 5/08* (2006.01)
(Continued)

(52) U.S. Cl.
CPC .......... *H05K 1/0237* (2013.01); *H01P 3/081* (2013.01); *H01Q 1/2283* (2013.01); *H01Q 1/38* (2013.01);
(Continued)

(58) Field of Classification Search
CPC .... H01P 3/08; H01P 5/08; H05K 1/02; H05K 1/14
(Continued)

(56) References Cited

U.S. PATENT DOCUMENTS 5,583,468 A * 12/1996 Kielmeyer ............ H01L 24/49
333/247
5,777,528 A * 7/1998 Schumacher ............ H01P 5/08
333/246
(Continued)

FOREIGN PATENT DOCUMENTS

CN    1825703 A    8/2006
EP    1148572 A1    10/2001
(Continued)

OTHER PUBLICATIONS

Zhou et al., Broadband Substrate to Substrate Interconnection, Nov. 2015, Progress in Electromagnetics Research, vol. 59 143-147.*
(Continued)

*Primary Examiner* — Dean Takaoka

(57) ABSTRACT

A wide bandwidth circuit board arrangement includes two coplanar substrates separated by a predetermined gap, and at least one bond wire arranged across the gap and interconnecting a respective conducting microstrip line on a first side of each respective substrate. Further, the arrangement includes at least one open stub arrangement configured on the first side of each respective substrate, each open stub arrangement comprising a microstrip extending at an angle from an end of each conducting strip on each respective substrate. Finally, the arrangement includes a ground layer on a second side of each respective substrate, and a defected ground structure arranged on the second side of each respective substrate and laterally overlapping each respective open stub arrangement arranged on the first side.

6 Claims, 6 Drawing Sheets

(51) Int. Cl.
*H05K 1/14* (2006.01)
*H05K 1/02* (2006.01)
*H01Q 1/38* (2006.01)
*H01Q 1/22* (2006.01)
*H01Q 1/48* (2006.01)
*H05K 3/10* (2006.01)
*H05K 3/46* (2006.01)
*H05K 1/11* (2006.01)

(52) U.S. Cl.
CPC ............ *H01Q 1/48* (2013.01); *H05K 1/025* (2013.01); *H05K 1/0213* (2013.01); *H05K 1/14* (2013.01); *H05K 1/142* (2013.01); *H05K 3/10* (2013.01); *H05K 3/4644* (2013.01); *H01L 2924/19107* (2013.01); *H05K 1/117* (2013.01); *H05K 2201/04* (2013.01); *H05K 2201/0979* (2013.01); *H05K 2203/049* (2013.01)

(58) Field of Classification Search
USPC .......................................... 333/33, 247, 260
See application file for complete search history.

(56) References Cited

U.S. PATENT DOCUMENTS

| | | | | |
|---|---|---|---|---|
| 6,426,686 | B1* | 7/2002 | Douriet | H01L 23/66 257/664 |
| 6,847,275 | B2* | 1/2005 | Sayanagi | H01L 23/66 257/728 |
| 6,924,714 | B2* | 8/2005 | Jain | H01P 1/268 333/123 |
| 7,498,907 | B2* | 3/2009 | Suzuki | H01L 23/552 333/12 |
| 7,688,164 | B2* | 3/2010 | Katayama | H01P 5/08 333/246 |
| 2001/0048155 | A1 | 12/2001 | Budka | |
| 2008/0042775 | A1 | 2/2008 | Yang et al. | |
| 2009/0079523 | A1 | 3/2009 | Hsu | |
| 2010/0085130 | A1 | 4/2010 | Margomenos | |

FOREIGN PATENT DOCUMENTS

| | | |
|---|---|---|
| EP | 1783855 A1 | 5/2007 |
| JP | H1013105 A | 1/1998 |
| JP | 2002009510 A | 1/2002 |

OTHER PUBLICATIONS

Lee, Wideband Characterization of Mutual Coupling Between High Density Bonding Wires, IEEE Microwave and Guided Wave Letters, vol. 4, No. 8, pp. 265-267, Aug. 1994.

Lim, et al., RF Characterization and Modeling of Various Wire Bond Transitions, IEEE Transactions on Advanced Packaging, vol. 28, No. 4, pp. 772-778, Nov. 2005.

Wang, et al., Layout and Process Characteristics of LTCC Substrate for Microwave Module, 2009 IEEE International Symposium on Radio-Frequency Integration Technology, pp. 361-366, 2009.

Geist, Broadband microwave Circuit Interconnection, IEEE Proceeding of German Microwave Conference, pp. 231-234, 2010.

* cited by examiner

TOP SIDE          BOTTOM SIDE

METHOD AND ARRANGEMENT FOR BOARD-TO-BOARD INTERCONNECTION

This application is a 371 of International Application No. PCT/CN2013/086407, filed Nov. 1, 2013, the disclosure of which is fully incorporated herein by reference.

TECHNICAL FIELD

The proposed technology generally relates to wide bandwidth circuit board arrangements, and particularly to methods and arrangements for interconnecting such arrangements.

BACKGROUND

In present day microelectronics design, one ongoing goal is to reduce the size of any integrated circuit and to fit as much functionality as possible onto a single substrate. However, due to high power signals leakage and interferers (high power local oscillation signals leak through PCB substrate to interfere transmitter/receiver part) it is sometimes necessary to separate circuits onto different substrates and sometimes it's physically impossible to fit all components onto a single circuit board, thus making it necessary to place components on different circuit boards. It is therefore important to be able to interconnect the circuits between two circuit boards or substrates whilst maintaining a high performance and avoid limiting the available bandwidth.

One common way to interconnect circuit boards or substrates is to use bond wires or even bond strips, typically gold bond wires or strips. However, a bond wire or strip adds a low pass element to the microwave system and limits the bandwidth of the circuit. Some variants of interconnecting boards whilst enhancing the bandwidth of the board to board connection include using multiple bond wires has been shown in [1-2]. Other variants include gold bond strips [3], and a compensated microstrip line [4].

However, as mentioned above, a bond wire adds a low pass element to the microwave system and limits the bandwidth of the circuit. Broadband interconnection using bond wires can be achieved by adopting multiple bond wires [1-2] and compensated microstrip lines [3-4].

Using multiple golden bond wires result in cost increasing and it is impossible to use more than 5 piece bond wires due to process limitation, so the bandwidth is still limited by the limited quantity of bond wires. In a corresponding manner, the use of golden bond strip is extremely high cost due to using volume golden material. And finally, it is impossible to etch compensated microstrip line thinner than 0.1 mm due to printed circuit board (PCB) fabrication process, which limits its application. So it cannot be used on interconnection where the compensated microstrip line thinner than 0.1 mm.

There is thus a need to provide board-to-board interconnections that enable maintaining a high bandwidth for e.g. microwave applications whilst avoiding the above-described problems.

SUMMARY

It is an object to provide a solution that obviates the above-described problems.

This and other objects are met by embodiments of the proposed technology.

According to a first aspect, there is provided a wide bandwidth circuit board arrangement including two coplanar substrates separated by a predetermined gap. Further, the arrangement includes, at least one bond wire arranged across the gap and connecting a respective conducting microstrip line on a first side of each respective substrate, and at least one open stub arrangement configured on the first side of each respective substrate, each open stub arrangement comprising a microstrip extending at an angle from an end of each conducting strip on each respective substrate. Further, the arrangement includes a ground layer on a second side of each substrate, and a respective defected ground structure arranged on the second side of each respective substrate and laterally overlapping each respective open stub arrangement arranged on the first side.

According to a second aspect, there is provided a method of providing a wide bandwidth circuit board arrangement including two coplanar substrates separated by a predetermined gap. The method includes the steps of providing at least one bond wire across the gap and interconnecting a respective conducting strip on a first side of each respective substrate, and forming at least one open stub arrangement on the first side of each respective substrate, each open stub arrangement comprising a microstrip extending at an angle from an end of each the conducting strip on each respective substrate. Further, the method includes forming a ground layer on a second side of each substrate. Finally, the method includes forming a defected ground structure on the second side of each respective substrate laterally overlapping each respective open stub arrangement.

Embodiments of the proposed technology enable interconnecting substrates whilst maintaining a high bandwidth.

Other advantages will be appreciated when reading the detailed description.

BRIEF DESCRIPTION OF THE DRAWINGS

The embodiments, together with further objects and advantages thereof, may best be understood by referring to the following description taken together with the accompanying drawings, in which.

ABBREVIATIONS

DGS Defected Ground Structure
EM ElectroMagnetic
LO Local Oscillation
MCM Multi Chip Module
MMIC Monolithic Microwave Integrated Circuit
PCB Printed Circuit Board
VNA Vector Network Analyzer

DETAILED DESCRIPTION

Throughout the drawings, the same reference numbers are used for similar or corresponding elements.

For a better understanding of the proposed technology, it may be useful to begin with a brief overview of the use of bond wires as well as the use of defected ground structures.

Figure 1:
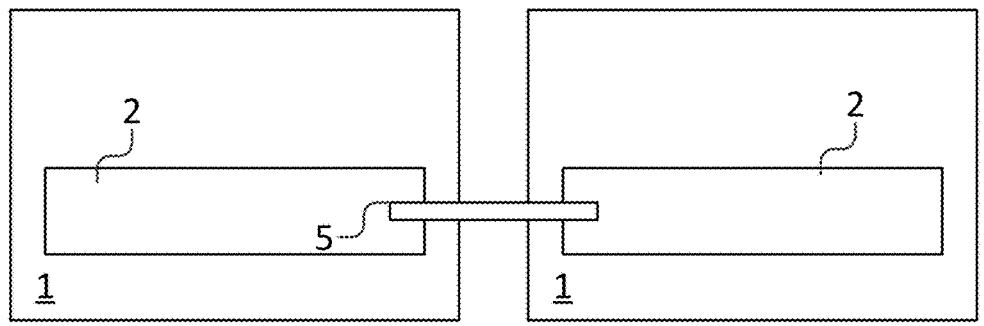
FIG. 1 is an illustration of a known board-to-board interconnection.

Bond wires are massively used in monolithic microwave integrated circuits (MMICs) and multi-chip modules (MCMs) for signal transmission among different types of substrates. Board to board interconnection is significant important when it comes to following applications: First, to achieve higher isolation among transmitted, received and local oscillation (LO) parts of a transceiver, each part of above circuit needs to be designed on a separated circuit board to avoid signal leakage through substrate, especially LO leakage. Secondly, sometimes it's impossible to place all components on a circuit board; components must be placed on different circuit board. Conventionally, bond wire is used to interconnect board to board circuits, shown in FIG. 1. The FIG. 1 illustrates a conventional board-to-board interconnection using a single bond wire (narrow band application below 4 GHz)

However, a bond wire adds a low pass element to the microwave system and limits the bandwidth of the system. Broadband interconnection using bond wires can be achieved by adopting multiple bond wires [1-2] and compensated microstrip lines [3-4]. But those approaches can't achieve higher frequencies exceed 20 GHz and it's impossible to etch compensated microstrip line thinner than 0.1 mm based on printed circuit board (PCB) fabrication process.

The inventors have identified the benefits of combining bond wires and defected ground structure (DGS) to enhance the bandwidth of board to board interconnections, which at the same time overcomes the fabrication limitation of PCB's.

The term defected ground structure (DGS) refers to the fact that it consists of a defect in the ground plane or layer of a substrate. The ground plane is typically considered to be an approximation of an infinite, perfectly-conducting current sink. Although the additional perturbations of the DGS alter the uniformity of the ground plane, they do not render it defective. The basic element of a DGS is a resonant gap or slot in the ground metal, placed directly under a transmission line and aligned for efficient coupling to the line. The equivalent circuit of a DGS is a parallel-tuned circuit in series with the transmission line to which it is coupled.

Figure 2:
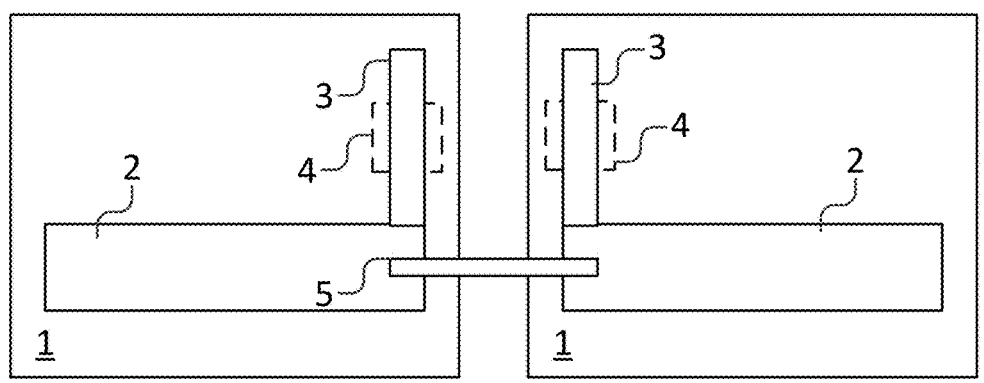
FIG. 2 is an illustration of an embodiment according to the proposed technology.

Accordingly, with reference to FIG. 2, an embodiment of a wide bandwidth circuit board arrangement according to the proposed technology includes two coplanar substrates 1 separated by a predetermined gap (g). The gap does in fact include both the distance between the two substrates 1 as well as the respective distance of opposing ends of the microstrip of each substrate 1 to the edge of the substrate 1. However, for simplicity reasons the gap is referred to as a board gap. The arrangement includes at least one bond wire 5 e.g. gold bond wire 5 arranged across gap and interconnecting a respective conducting microstrip line 2 on a first side 10 of each respective substrate 1. In other words, the bond wire(s) 5 bridge the gap between the two substrates 1. Further, the arrangement includes at least one open stub arrangement 3 configured on the first side 10 of each respective substrate 1, each open stub arrangement 3 comprises a microstrip extending at an angle from an end of each conducting strip 2 on each respective substrate 1. Thereby, the open stub arrangement 3 is coplanar with the microstrip 2 of each substrate and with the substrate 1 itself. In addition, the arrangement includes a ground layer on a second side 20 of each substrate 1. Finally, the arrangement includes a respective defected ground structure 4 arranged on the second side 20 of each respective substrate 1 and laterally overlapping each respective open stub arrangement 3 arranged on the first side 10. This can also be described such that each defected ground structure 4 is centered directly opposite its open stub arrangement 3. Thereby, the defected ground structure 4 is arranged with a centre line aligned with and directly opposite of the centerline of its open stub arrangement 3. The defected ground structure 4 is formed by, according to a particular embodiment, etched out sections of the ground layer.

Figure 3:
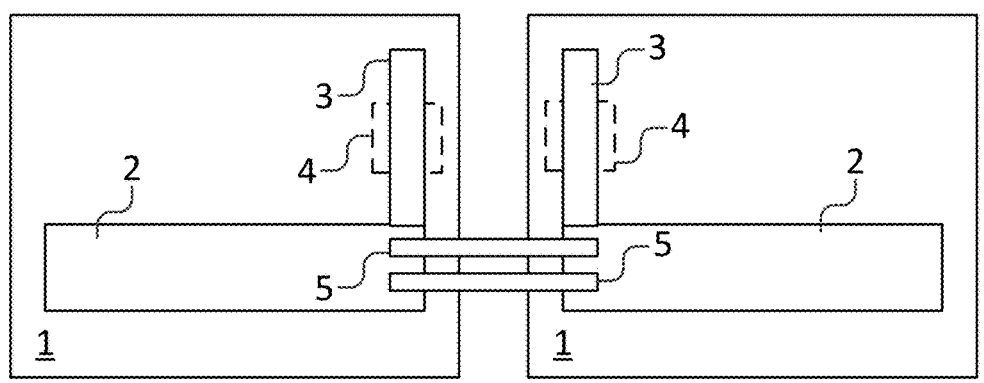
FIG. 3 is an illustration of a further embodiment according to the proposed technology.

With reference to FIG. 3, a further embodiment of the proposed technology includes multiple e.g. two, bond wires interconnecting the two substrates 1. Although not shown, a corresponding arrangement with three bond wires can be envisioned in a similar manner.

Figure 4:
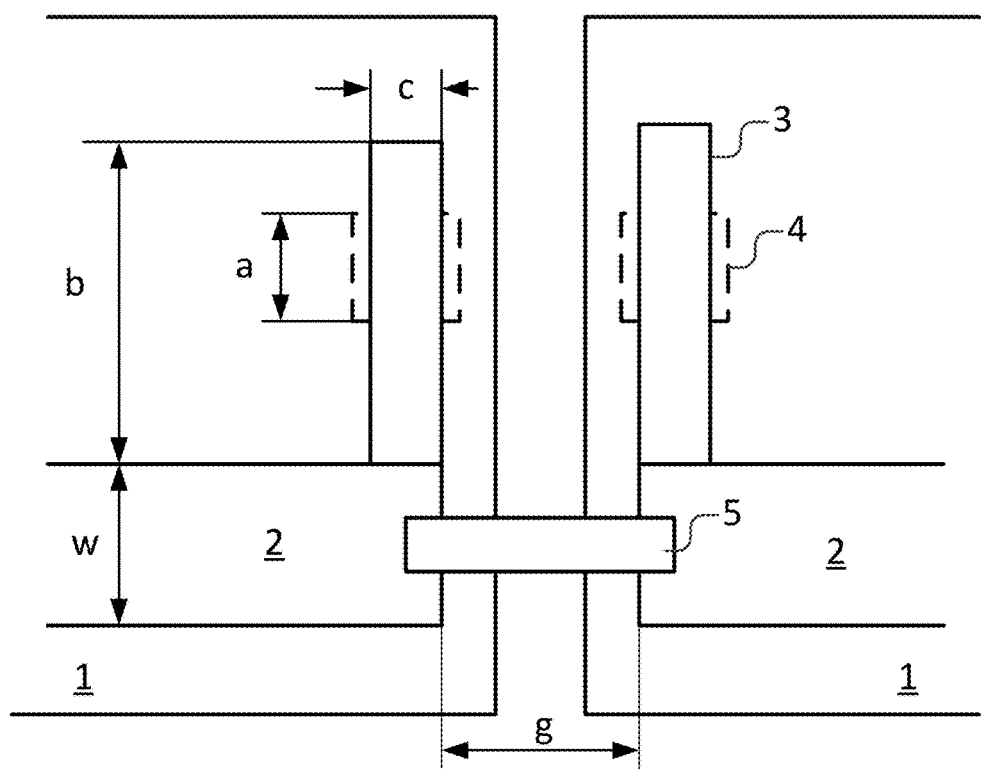
FIG. 4 is an enlarged section of the embodiment in FIG. 2.

In order to facilitate the further understanding of the benefits and theory supporting the proposed technology, an enlarged view of the board to board interconnecting arrangement is shown in FIG. 4. In this illustration the width of the microstrip line 2 of each substrate 1 is denoted w, the width of the defected ground structure 4 is denoted with a, the length of the open stub arrangement 3 is denoted with b, and the width of the open stub arrangement 3 is dented with c.

Figure 5:
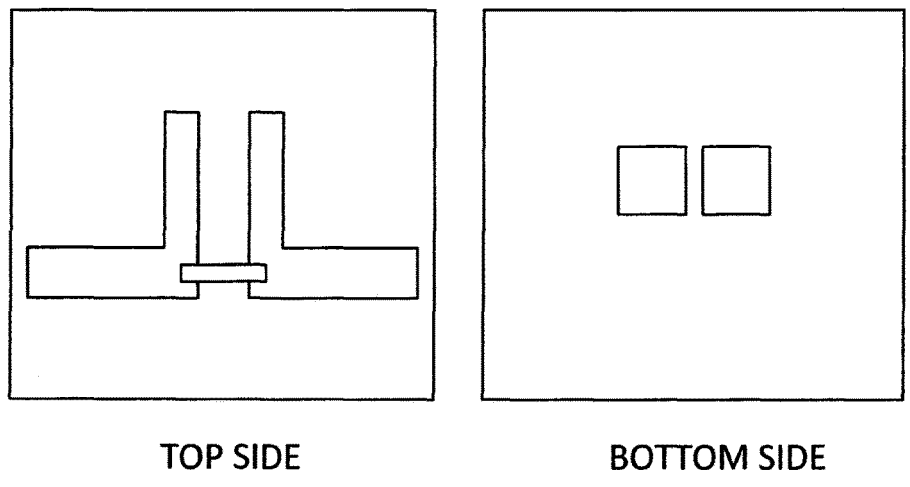
FIG. 5 is an illustration of two different views of the embodiment in FIG. 2.
Figure 6:
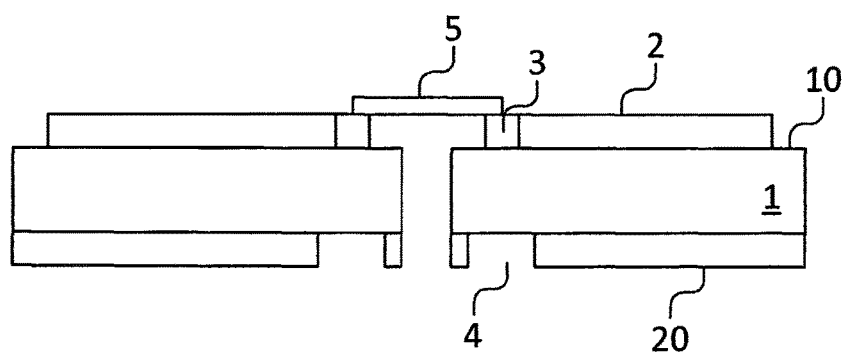
FIG. 6 is a side view of an embodiment of the proposed technology.

An illustration on how the board to board interconnecting arrangement might look when viewed from a first or top side 10 of the substrate 1 and a second or bottom side 20 of the substrate 1 is shown in FIG. 5. A corresponding side view is illustrated in FIG. 6, in order to illustrate the ground layer and the "etched out" nature of the defected ground structure 4.

As mentioned, an embodiment of the proposed technology is shown in FIG. 3. A bond wire is equivalent to an inductor L that jeopardizes broadband application at microwave frequency. Compensation of the bond wire inductivity L can be achieved by adding further capacitance microstrip open stubs. This resulting circuit resembles a three element low pass structure. After simulation with Microwave Office, the highest cut-off frequency of the proposed structure (without DGS) can be achieved when impedance of open stubs are both 250Ω, which is equivalent to 0.04 mm width microstrip line on a so called Rogers 4003C substrate with a dielectric constant of 3.38 and a thickness of 0.508 mm. However, it's impossible to etch microstrip line thinner than 0.1 mm based on current PCB fabrication process.

Figure 7:
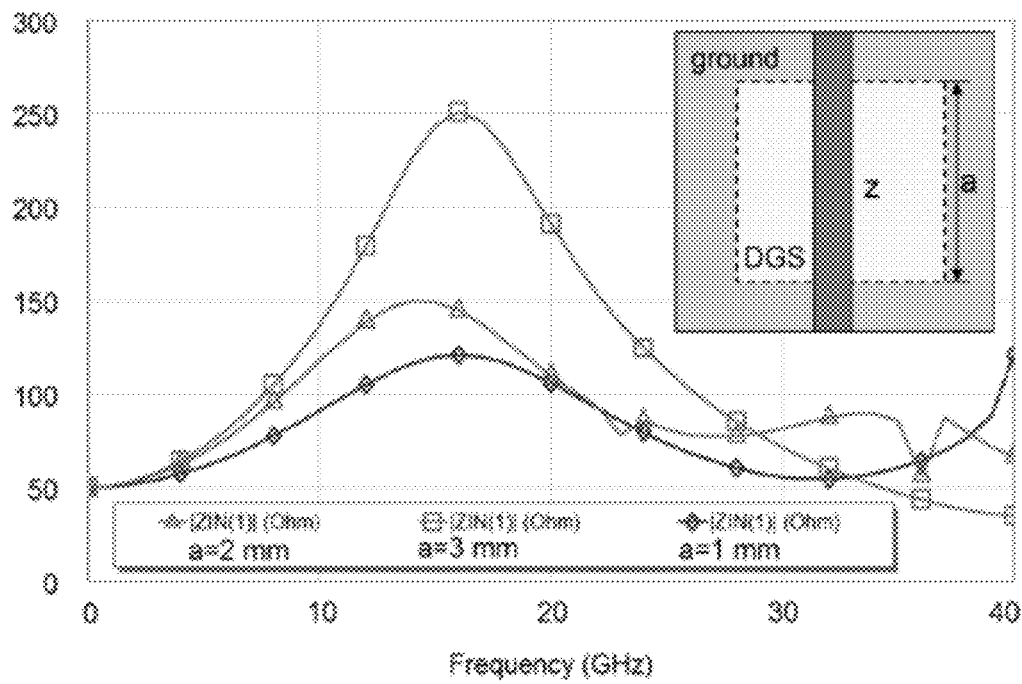
FIG. 7 is a graph illustrating the effect of embodiments of the proposed technology.

To solve the problem, we proposed to etch square-shaped DGS under each open stub to achieve higher impedance without narrowing the width of the open stubs. The dependency of the impedance value Z and different length of DGS was simulated using Microwave Office, shown in FIG. 7. Parameter "a" is the side length of a square-shaped DGS. We can see that impedance are 120 (a=1 mm), 150 (a=2 mm) and 250Ω (a=3 mm) at 16 GHz, respectively.

Although illustrated as square DGS elements 4, it is possible to design and etch DGS 4 that have a non-square shape configured in dependence on the design of one or more of the particular substrates 1, microstrip lines 2 and open stub arrangements 3.

Figure 8:
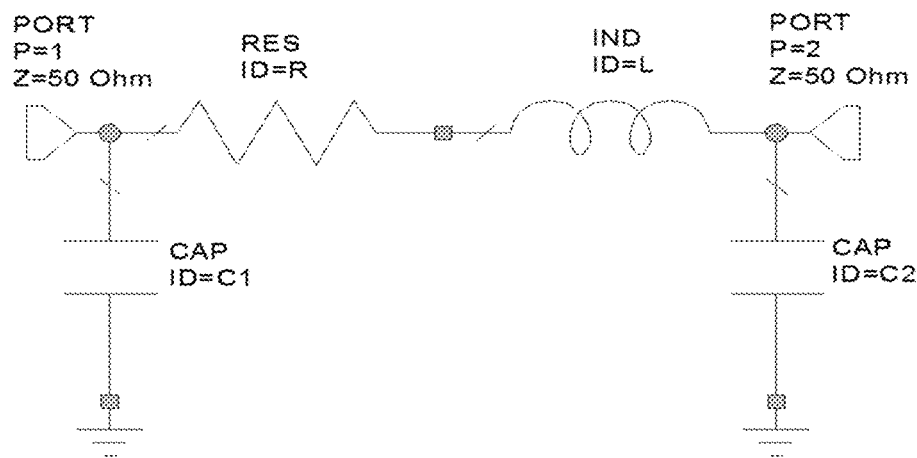
FIG. 8 is an equivalent circuit of an embodiment.

FIG. 8 illustrates a lumped element equivalent circuit of the low pass structure of the board-to-board interconnecting arrangement according to the proposed technology. The inductance ID=L corresponds to the bond wire(s), the capacitances ID=C1, ID=C2 correspond to the respective open stub arrangements 3 of each substrate 1.

Figure 9:
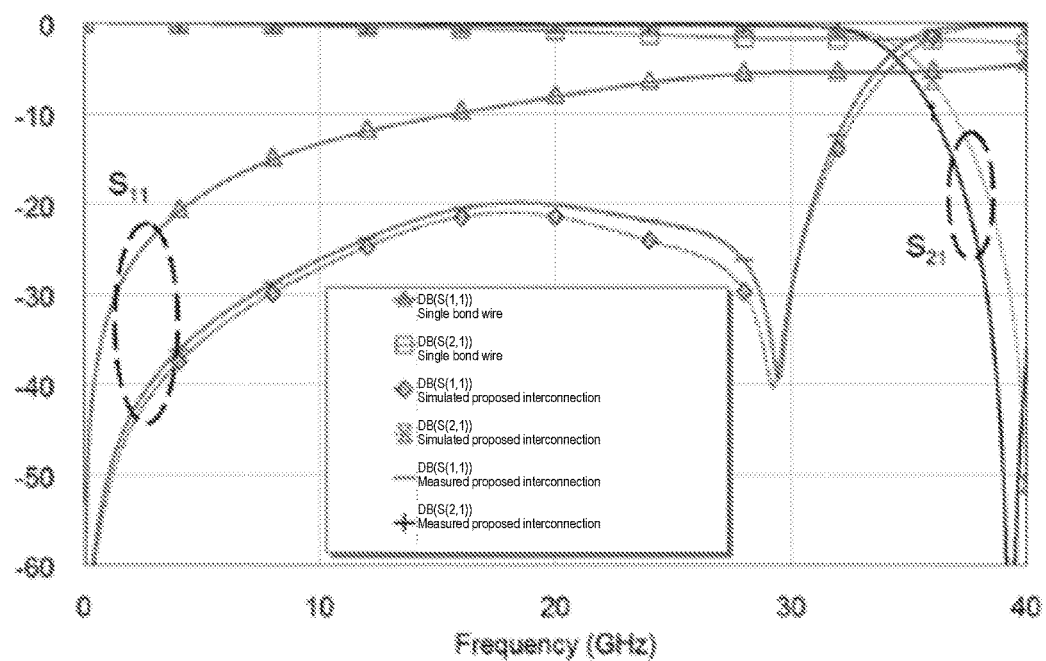
FIG. 9 is a graph illustrating a comparison between known technology and embodiments of the proposed technology.

In FIG. 9 a comparison of the scattering parameters or so-called S-parameters of the board-to-board interconnection of the proposed technology and a conventional approach using a single bond wire is illustrated. The S-parameters describe the electrical behaviour of linear electrical networks when undergoing various steady state stimuli by electrical signals. They are applicable at any frequency, but are mostly used for networks operating at radio frequency and microwave frequencies.

It is noted that in the schematic illustration of FIG. 5, depicting the top side and the bottom side of an embodiment of the proposed technology, all features may be presented on a single substrate, but the illustration is easily transferred to the factual case of interconnecting two separate substrates 1.

Figure 10:
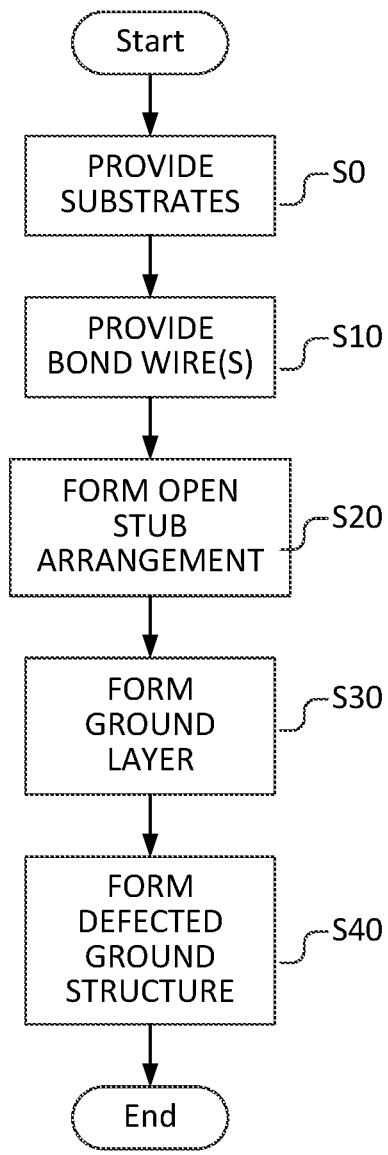
FIG. 10 is a flow chart illustrating an embodiment of the proposed technology.

With reference to FIG. 10 an embodiment of a method of manufacturing or providing a wide bandwidth circuit board arrangement according to the proposed technology will be described. Two coplanar substrates 1 separated by a predetermined gap g are initially provided in step S0. At least one bond wire 5 is provided, in step S10, across the gap to interconnect a respective conducting microstrip line 2 on a first side 10 of each substrate 1. Then, at least one open stub arrangement 3 is formed, in step S20, on the first side 10 of each substrate 1, such that each open stub arrangement 3 comprises a microstrip extending at an angel from an end of each conducting microstrip line 2 on each substrate 1. Further, a ground layer is formed, in step S30, on a second side 20 of each substrate 1. Finally, in step S40, a defected ground structure 4 is formed on the second side 20 of each substrate 1 laterally overlapping each respective open stub arrangement 3.

Although described in a particular order above the steps of the embodiments can be performed in an another order. However, preferably all structures of the arrangement are provided and formed before the bond wire(s) is/are provided. The bond wires can be provided by soldering or other types of bonding known in the art.

In addition, although described with bond wires, the embodiments are likewise applicable for embodiments employing one or more bond strips e.g. gold strips to interconnect the two substrates.

According to a particular embodiment the defected ground structure is formed S40 by etching away at least part of the ground layer on the second side 20 directly opposite each open stub arrangement 3. However, other methods of providing the defected ground structure can also be used.

An example embodiment of a method of designing a board-to-board interconnecting arrangement with two bond wires 5 according to the proposed technology will be described below.

Step. 1

The proposed structure is established with open stubs by a three-stage low pass filter theory, shown in FIG. 3. The impedance of input/output microstrip line 2 is 50Ω and open stub 3 is located at the end of each microstrip line 2. The only design variables are width c and length b of the open stub 3, shown in FIG. 4. Tune and optimize the two variables using Microwave simulator (AWR Microwave Office).

Step. 2

Create schematic diagram of the DGS structure. FIG. 8 shows the lumped element equivalent circuit of the low pass structure. Double pieces of parallel bond wires are treated as a resistor in series with an inductance, and open stubs are equivalent to capacitors.

Step. 3 Calculate the lumped elements equivalent circuits of the proposed low pass structure to derive the values of inductance L, resistance R and capacitance C1 and C2 as follows in Equations 1-3:

$$L = (\mu_0 l / 2\pi) x [\ln(4l/d) + \mu_r \tanh(4d_s/d)/4 - 1] \quad (1)$$

$$R = (4\rho l / \pi d^2)(0.25 d / d_s + 0.2654) \quad (2)$$

$$C_1 = C_2 = \frac{\tan(\beta_b l / 2)}{\omega Z_i} \quad (3)$$

where $\mu_r$ and $\mu_0$ is the relative permeability of a gold bond wire and the air ($\mu_r$=1 and $\mu_0$=4π×10$^{-7}$ H/m). $\beta_b$, $d_s$, l and d is the propagation constant, skin depth, length and diameter of the bond wire, respectively.

Step. 4

Use a Cheyshev low pass prototype filter with a passband ripple $L_{Ar}$=0.1 dB, the element value are $g_0$=1, $g_1$=0.8431, $g_2$=0.6220, $g_3$=1.3554. After transferring frequency and impedance level to required value, those element value are R=55Ω, L=50 pH and $C_1$=$C_2$=26 fF. The proposed low pass structure is implemented on a RO4003C substrate with a dielectric constant of 3.38 and a thickness of 0.508 mm. FIG. 10 shows the photograph of the proposed broadband board-to-board interconnection.

Step. 5

Implement EM-simulation with full-wave EM-simulator (AWR AXIEM) and fabricate the circuit. After optimization, length b and width c of the open stub are b=2.1 mm and c=0.8 mm. To acquire a broadband transmission with input return loss less than −20 dB, many dimensions need to be simulated. As shown in FIG. 9, measured $S_{11}$ is better than −20 dB and $S_{21}$ is better than −0.215 dB blew 30 GHz by e.g. Agilent N5230C network analyzer.

In the two-wire embodiment of the proposed technology the highest illustrated frequency is 32 GHz whereas 4 GHz is the highest frequency of a conventional single bond wire solution, S-parameters are shown in FIG. 9.

The embodiments of the proposed technology can be beneficially used in any electronic equipment for radio frequency or microwave frequency applications where a high bandwidth is required and where it is necessary to arrange circuits on different substrates. Such electronic equipment can include wired or wireless devices. As used herein, the term "wireless device" may refer to a User Equipment, UE, a mobile phone, a cellular phone, a Personal Digital Assistant, PDA, equipped with radio communication capabilities, a smart phone, a laptop or Personal Computer, PC, equipped with an internal or external mobile broadband modem, a tablet PC with radio communication capabilities, a portable electronic radio communication device, an electronic device on satellite, an electronic device on radar, an electronic device on military missile, a sensor device equipped with radio communication capabilities or the like. In particular, the term "UE" should be interpreted as a non-limiting term comprising any device equipped with radio circuitry for wireless communication according to any relevant communication standard.

Other examples are radio network nodes or network nodes in a telecommunication system. As used herein, the term "radio network node" or simply "network node" may refer to base stations, network control nodes, and the like. In particular, the term "base station" may encompass different types of radio base stations including standardized base stations such as Node Bs, or evolved Node Bs, eNBs, and also macro/micro/pico radio base stations, home base stations, also known as femto base stations, relay nodes, repeaters, radio access points, and even radio control nodes controlling one or more Remote Radio Units, RRUs, or the like.

It will be appreciated that the methods and devices described above can be combined and re-arranged in a variety of ways.

For example, embodiments may be implemented in hardware, or in software for execution by suitable processing circuitry, or a combination thereof.

Some of the advantages with the embodiments of the proposed technology include:

Great bandwidth enhancement: (32−4)/4=800% bandwidth enhancement.

Overtime PCB, LTCC and LCP fabrication process: Width of microstrip line can't be less than 0.1 mm due to fabrication process limitation. The width of PCB need not to be narrow than 0.1 mm to achieve broadband interconnection.

Harmonics suppression characteristics: saving filters for harmonics suppression and high performance.

Cost saving: The proposed technology does not need multiple (more than 3) golden bond wires, which is s a great cost reduction due to use less gold material.

The embodiments described above are merely given as examples, and it should be understood that the proposed technology is not limited thereto. It will be understood by those skilled in the art that various modifications, combinations and changes may be made to the embodiments without departing from the present scope as defined by the appended claims. In particular, different part solutions in the different embodiments can be combined in other configurations, where technically possible.

REFERENCES

[1] H. Y. Lee, *Wideband characterization of mutual coupling between high density bonding wires*, IEEE Trans Microwave Theory Tech 4 (1994), 265-267.

[2] J. H. Lim, D. H. Kwon, J. S. Rieh, S. W. Kim and S. W. Hwang, *RF characterization and modeling of various wire bond transitions*, IEEE Trans Microwave Theory Tech 28 (2008), 265-267.

[3] Z. Wang and J. Yang, *Layout and process characteristics of LTCC substrate for microwave module*, IEEE international Symposium on radio-frequency integration technology, 2009, 361-366.

[4] T. Geist, *Broadband microwave circuit interconnection*, IEEE proceeding of German Microwave Conference 2010, 231-234

The invention claimed is:

1. A wide bandwidth circuit board arrangement including two coplanar substrates separated by a predetermined gap, comprising:
   at least one bond wire arranged across said gap and interconnecting a respective conducting microstrip line on a first side of each respective substrate;
   at least one open stub arrangement configured on said first side of each said respective substrate, each said open stub arrangement comprising a microstrip extending at an angle from an end of each said conducting strip on each respective substrate;
   a ground layer on a second side of each respective substrate;
   a defected ground structure arranged on said second side of each respective substrate and laterally overlapping each respective open stub arrangement arranged on said first side.

2. The arrangement according to claim 1, comprising at least two bond wires.

3. The arrangement according to claim 1, wherein each said open stub arrangement forming an L-shaped end structure together with each said conducting strip.

4. The arrangement according to claim 1, wherein said substrate is one of or on organic substrate, e.g., printed circuit board (PCB), or low temperature co-fired ceramic (LTCC) substrate or liquid crystal polymer (LCP) substrate.

5. The arrangement according to claim 1, wherein said defected ground structure and said open stub arrangement are laterally overlapping such that a center of each defected ground structure is arranged directly opposite a center of each said respective open stub arrangement.

6. A method of providing a wide bandwidth circuit board arrangement including two provided coplanar substrates separated by a predetermined gap, the method comprising:
   providing at least one bond wire across said gap and interconnecting a respective conducting microstrip line arranged on a first side of each respective substrate;
   forming at least one open stub arrangement on said first side of each said respective substrate, each said open stub arrangement comprising a microstrip extending at an angle from an end of each said conducting microstrip line on each respective substrate;
   forming a ground layer on a second side of each respective substrate;
   forming a defected ground structure on said second side of each respective substrate and laterally overlapping each respective open stub arrangement.

* * * * *